US012444715B2

(12) United States Patent
Tsai et al.

(10) Patent No.: US 12,444,715 B2
(45) Date of Patent: Oct. 14, 2025

(54) SEMICONDUCTOR PACKAGE STRUCTURE (71) Applicant: MediaTek Inc., Hsin-Chu (TW)

(72) Inventors: Yi-Lin Tsai, Hsinchu (TW); Wen-Sung Hsu, Hsin-Chu (TW); I-Hsuan Peng, Hsinchu (TW); Yi-Jou Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/489,814

(22) Filed: Oct. 18, 2023

(65) Prior Publication Data
US 2024/0047427 A1    Feb. 8, 2024

Related U.S. Application Data

(62) Division of application No. 17/208,198, filed on Mar. 22, 2021, now Pat. No. 11,830,851.
(Continued)

(51) Int. Cl.
*H01L 25/065* (2023.01)
*H01L 23/00* (2006.01)
(Continued)

(52) U.S. Cl.
CPC .......... *H01L 25/0657* (2013.01); *H01L 24/13* (2013.01); *H01L 24/14* (2013.01); *H01L 24/16* (2013.01); *H01L 24/32* (2013.01); *H01L 24/73* (2013.01); *H01L 25/18* (2013.01); *H01L 23/49822* (2013.01); *H01L 2224/13009* (2013.01); *H01L 2224/13025* (2013.01);
(Continued)

(58) Field of Classification Search
CPC ...... H01L 25/0657; H01L 24/13; H01L 24/14
See application file for complete search history.

(56) References Cited

U.S. PATENT DOCUMENTS 9,748,162 B2    8/2017    Wang et al.
10,636,773 B2    4/2020    Kuo et al.
(Continued)

FOREIGN PATENT DOCUMENTS

CN    103730379 A    4/2014
CN    104051390 A    9/2014
(Continued)

OTHER PUBLICATIONS

U.S. Appl. No. 17/208,198, filed Mar. 22, 2021, Tsai et al.
(Continued)

*Primary Examiner* — Errol V Fernandes
(74) *Attorney, Agent, or Firm* — McClure, Qualey & Rodack, LLP (57) ABSTRACT

A semiconductor package structure includes a substrate, a redistribution layer, a first semiconductor component, a conductive pillar, and a second semiconductor component. The redistribution layer is over the substrate. The first semiconductor component is over the redistribution layer. The conductive pillar is adjacent to the first semiconductor component, wherein the first semiconductor component and the conductive pillar are surrounded by a molding material. The second semiconductor component is over the molding material, wherein the second semiconductor component is electrically coupled to the redistribution layer through the conductive pillar.

14 Claims, 5 Drawing Sheets

Related U.S. Application Data (60) Provisional application No. 63/006,150, filed on Apr. 7, 2020.

(51) Int. Cl.
  *H01L 25/18* (2023.01)
  *H01L 23/498* (2006.01)

(52) U.S. Cl.
  CPC ............... *H01L 2224/13082* (2013.01); *H01L 2224/16146* (2013.01); *H01L 2224/16225* (2013.01); *H01L 2224/17181* (2013.01); *H01L 2224/32145* (2013.01); *H01L 2224/73253* (2013.01); *H01L 2225/06513* (2013.01); *H01L 2225/06517* (2013.01); *H01L 2225/0652* (2013.01); *H01L 2225/06544* (2013.01); *H01L 2225/06548* (2013.01)

(56) References Cited

U.S. PATENT DOCUMENTS

| | | | |
|---|---|---|---|
| 10,763,241 | B2 | 9/2020 | Tan |
| 10,847,869 | B2 | 11/2020 | Han et al. |
| 2013/0001762 | A1 | 1/2013 | Chi et al. |
| 2013/0161826 | A1 | 6/2013 | Son |
| 2013/0175686 | A1 | 7/2013 | Meyer et al. |
| 2014/0252579 | A1* | 9/2014 | Chang ................... H01L 23/481 257/676 |
| 2018/0053745 | A1 | 2/2018 | Cheng et al. |
| 2018/0082988 | A1 | 3/2018 | Cheng et al. |
| 2018/0204791 | A1 | 7/2018 | Chen et al. |
| 2019/0006315 | A1 | 1/2019 | Hsu et al. |
| 2019/0103387 | A1 | 4/2019 | Tsou et al. |
| 2019/0181092 | A1 | 6/2019 | Hsiung et al. |
| 2019/0279937 | A1* | 9/2019 | Chiu ................... H01L 23/5389 |
| 2019/0393153 | A1 | 12/2019 | Wang et al. |
| 2020/0020634 | A1 | 1/2020 | Tsai |
| 2020/0075546 | A1 | 3/2020 | Shih et al. |
| 2020/0091215 | A1* | 3/2020 | Jang ................... H01L 27/14618 |
| 2021/0098421 | A1* | 4/2021 | Wu ................... H01L 23/49811 |
| 2021/0313299 | A1 | 10/2021 | Tsai et al. |

FOREIGN PATENT DOCUMENTS

| | | |
|---|---|---|
| CN | 106960800 A | 7/2017 |
| CN | 107342271 A | 11/2017 |
| CN | 107731776 A | 2/2018 |
| CN | 110783327 A | 2/2020 |
| TW | 201712828 A | 4/2017 |
| TW | 201714260 A | 4/2017 |
| TW | 201810575 A | 3/2018 |
| TW | 201903994 A | 1/2019 |

OTHER PUBLICATIONS

German language office action dated Mar. 27, 2023, issued in application No. DE 10 2021 107 982.9.
German language office action dated Dec. 1, 2020, issued in application No. DE 10 2021 107 982.9.
Chinese language office action dated Sep. 1, 2021, issued in application No. TW 110112115.
Chinese language office action dated Nov. 29, 2024, issued in application No. CN 202110357465.2.

* cited by examiner

SEMICONDUCTOR PACKAGE STRUCTURE

CROSS REFERENCE TO RELATED APPLICATIONS

This application is a Division of U.S. application Ser. No. 17/208,198, filed Mar. 22, 2021, entitled "SEMICONDUCTOR PACKAGE STRUCTURE", which claims the benefit, under 35 U.S.C. 119(e), of U.S. Provisional Application No. 63/006,150 filed on Apr. 7, 2020. These applications are incorporated herein by reference in their entirety.

BACKGROUND OF THE INVENTION

Field of the Invention

The present invention relates to semiconductor packaging technology, and in particular to a semiconductor package structure.

Description of the Related Art

As a result of the progress being made in the semiconductor industry, smaller package structures that take up less space than the previous generation of package structures is required. One technological solution is heterogeneous integration, which is to integrate multiple semiconductor dies within the same package. As such, manufacturing costs can be reduced while still being able to provide high performance and high density.

Although existing semiconductor package structures are generally adequate for their intended purposes, they are not satisfactory in all respects. For example, in some package structures, a copper-copper (Cu—Cu) bonding technology is utilized to provide interconnections between the semiconductor dies. In this case, high temperature and enough time for inter-diffusion between two Cu layers are required, which raises the cost and leads to difficulties in the manufacturing process. Therefore, there is a need to further improve the semiconductor package structure to reduce production costs and increase the yield.

BRIEF SUMMARY OF THE INVENTION

Semiconductor package structures are provided. An exemplary embodiment of a semiconductor package structure includes a substrate, a redistribution layer, a first semiconductor component, a conductive pillar, and a second semiconductor component. The redistribution layer is over the substrate. The first semiconductor component is over the redistribution layer. The conductive pillar is adjacent to the first semiconductor component, wherein the first semiconductor component and the conductive pillar are surrounded by a molding material. The second semiconductor component is over the molding material, wherein the second semiconductor component is electrically coupled to the redistribution layer through the conductive pillar.

Another exemplary embodiment of a semiconductor package structure includes a substrate, a redistribution layer, a first semiconductor component, a through via, and a second semiconductor component. The redistribution layer is over the substrate. The first semiconductor component is over the redistribution layer and has a first surface and a second surface opposite to the first surface. The through via is in the first semiconductor component and extends from the first surface of the first semiconductor component to the second surface of the first semiconductor component. The second semiconductor component is over the first semiconductor component, wherein the second semiconductor component is electrically coupled to the first semiconductor component through a plurality of bump structures and electrically coupled to the redistribution layer through the plurality of bump structures and the through via.

Yet another exemplary embodiment of a semiconductor package structure includes a substrate, a redistribution layer, a plurality of first bump structures, a first semiconductor component, and a second semiconductor component. The redistribution layer is over the substrate and has a first surface and a second surface opposite to the first surface. The plurality of first bump structures are on the first surface of the redistribution layer and electrically couple the redistribution layer to a wiring structure of the substrate. The first semiconductor component is on the first surface of the redistribution layer and is adjacent to the plurality of first bump structures. The second semiconductor component is on the second surface of the redistribution layer, wherein the second semiconductor component is electrically coupled to the first semiconductor component through the redistribution layer, and is electrically coupled to the wiring structure of the substrate through the plurality of first bump structures.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Semiconductor package structures are described in accordance with some embodiments of the present disclosure. Each of the semiconductor package structures includes semiconductor components which are stacked by bump structures and/or by a redistribution layer instead of Cu—Cu bonding technology, so that the difficulty of manufacturing can be reduced, and the manufacturing costs can be lowered.

Figure 1:
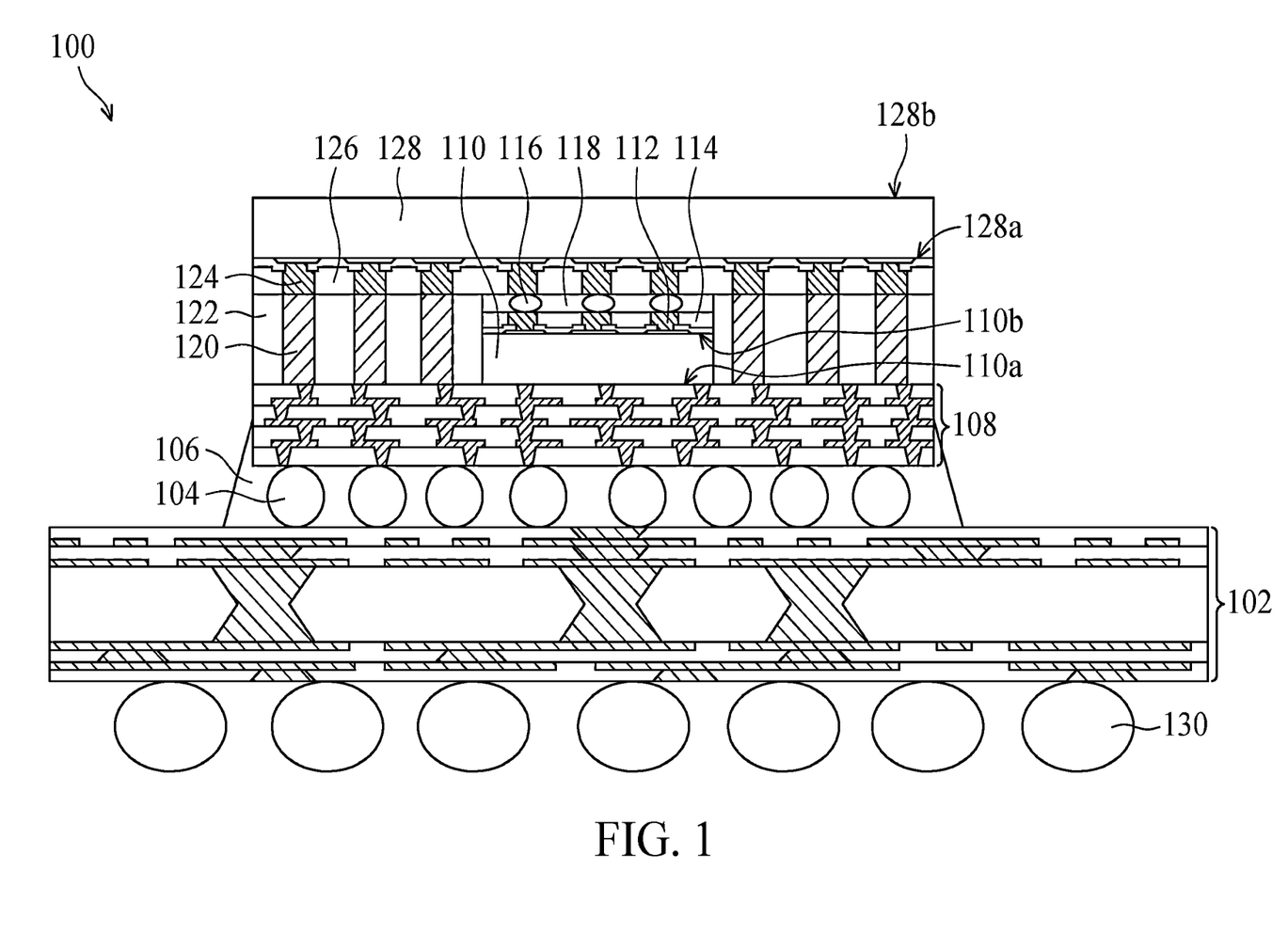
FIGS. 1-5 are cross-sectional views of semiconductor package structures in accordance with some embodiments.

FIG. 1 is a cross-sectional view of a semiconductor package structure 100 in accordance with some embodiments. Additional features can be added to the semiconductor package structure 100. Some of the features described below can be replaced or eliminated for different embodiments. To simplify the diagram, only a portion of the semiconductor package structure 100 are illustrated.

As shown in FIG. 1, the semiconductor package structure 100 includes a substrate 102, in accordance with some embodiments. In some embodiments, the substrate 102 includes an insulating core, such as a fiberglass reinforced resin core, to prevent the substrate 102 from warpage. The substrate 102 may have a wiring structure therein. In some embodiments, the wiring structure of the substrate 102 includes conductive layers, conductive vias, conductive pillars, the like, or a combination thereof. The wiring structure of the substrate 102 may be formed of metal, such as copper, titanium, tungsten, aluminum, the like, or a combination thereof.

The wiring structure of the substrate 102 may be disposed in inter-metal dielectric (IMD) layers. In some embodiments, the IMD layers may be formed of organic materials, such as a polymer base material, an non-organic material, such as silicon nitride, silicon oxide, silicon oxynitride, the like, or a combination thereof. It should be noted that the configuration of the substrate 102 shown in the figures is exemplary only and is not intended to limit the present disclosure. Any desired semiconductor element may be formed in and on the substrate 102. However, in order to simplify the diagram, only the flat substrate 102 is illustrated.

In some embodiments, the semiconductor package structure 100 includes a redistribution layer 108 over the substrate 102. The redistribution layer 108 may be bonded onto the carrier substrate 102 through a plurality of conductive structures 104. The conductive structures 104 may be formed between the redistribution layer 108 and the substrates 102, and may electrically couple the redistribution layer 108 to the substrates 102. In some embodiments, the conductive structures 104 include conductive materials, such as metal. For example, the conductive structures 104 may be made of copper, titanium, tungsten, aluminum, the like, or a combination thereof. The conductive structures 104 may be microbumps, controlled collapse chip connection (C4) bumps, ball grid array (BGA) balls, the like, or a combination thereof.

The conductive structures 104 may be surrounded by an underfill material 106. In some embodiments, the underfill material 106 is disposed between the substrates 102 and the redistribution layer 108, and fills in gaps between the conductive structures 104 to provide structural support. In some embodiments, the underfill material 106 may be dispensed with capillary force after the conductive structures 104 are formed between the substrates 102 and the redistribution layer 108. Then, the underfill material 106 may be cured using a suitable curing process, such as a thermal cure process, a ultra-violet (UV) cure process, or the like. The underfill material 106 may be formed of polymer, such as epoxy.

The underfill material 106 may cover a portion of the top surface of the substrate 102, and another portion of the top surface of the substrate 102 may be exposed. The underfill material 106 may extend to the sidewall of the redistribution layer 108, and may cover a portion of the sidewall of the redistribution layer 108.

The redistribution layer 108 may include one or more conductive layers and passivation layers, wherein the one or more conductive layers may be disposed in the one or more passivation layers. The conductive layers may include metal, such as copper, titanium, tungsten, aluminum, the like, or a combination thereof. In some embodiments, the passivation layers is a polymer layer, for example, polyimide (PI), polybenzoxazole (PBO), benzocyclobutene (BCB), epoxy, the like, or a combination thereof. Alternatively, the passivation layers may be a dielectric layer, such as silicon oxide, silicon nitride, silicon oxynitride, the like, or a combination thereof.

As shown in FIG. 1, the semiconductor package structure 100 includes a first semiconductor component 110 over the redistribution layer 108, in accordance with some embodiments. In some embodiments, the first semiconductor component 110 is an active device. For example, the first semiconductor component 110 may include a system-on-chip (SoC) die, a logic device, a memory device, a radio frequency (RF) device, the like, or any combination thereof. For example, the first semiconductor component 110 may include a microcontroller (MCU), a microprocessor (MPU), a power management integrated circuit (PMIC), a global positioning system (GPS) device, a central processing unit (CPU), a graphics processing unit (GPU), a dynamic random access memory (DRAM) controller, a static random-access memory (SRAM), a high bandwidth memory (HBM), the like, or any combination thereof. In some other embodiments, the first semiconductor component 110 includes a passive device, such as resistor, capacitor, inductor, the like, or a combination thereof.

The first semiconductor component 110 may have a first surface 110a and a second surface 110b which is opposite to the first surface 110a. The first surface 110a may be closer to the redistribution layer 108 than the second surface 110b. As shown in FIG. 1, the first surface 110a of the first semiconductor component 110 may be in contact with the redistribution layer 108 in some embodiments. Alternatively, the first surface 110a of the first semiconductor component 110 may be spaced apart from the redistribution layer 108 by a gap in some other embodiments. The redistribution layer 108 may laterally extend beyond the sidewalls of the first semiconductor component 110.

A plurality of conductive vias 112 and a passivation layer 114 may be disposed on the second surface 110b of the first semiconductor component 110. The conductive vias 112 may be disposed in the passivation layer 114 and may be electrically coupled to the first semiconductor component 110. The conductive vias 112 may include metal, such as copper, titanium, tungsten, aluminum, the like, or a combination thereof. In some embodiments, the passivation layer 114 is a polymer layer, for example, polyimide (PI), polybenzoxazole (PBO), benzocyclobutene (BCB), epoxy, the like, or a combination thereof. Alternatively, the passivation layer 114 may be a dielectric layer, such as silicon oxide, silicon nitride, silicon oxynitride, the like, or a combination thereof.

As shown in FIG. 1, the semiconductor package structure 100 includes a plurality of bump structures 116 over the conductive vias 112, in accordance with some embodiments. The bump structures 116 may be electrically coupled to the first semiconductor component 110. In some embodiments, the bump structures 116 include conductive materials, such as metal. For example, the bump structures 116 may be made of copper, titanium, tungsten, aluminum, the like, or a combination thereof. The bump structures 116 may be microbumps, controlled collapse chip connection (C4) bumps, ball grid array (BGA) balls, the like, or a combination thereof.

The bump structures 116 may be surrounded by an underfill material 118. In some embodiments, the underfill material 118 fills in gaps between the bump structures 116 to provide structural support. The underfill material 118 may include non-conductive paste (NCP), non-conductive film (NCF), the like, or a combination thereof, and may be formed of polymer, such as epoxy.

As shown in FIG. 1, the semiconductor package structure 100 includes one or more conductive pillars 120 over the redistribution layer 108, in accordance with some embodiments. The conductive pillars 120 may be adjacent to the first semiconductor component 110 and may be disposed on opposite sides of the first semiconductor component 110. The conductive pillars 120 may be electrically coupled to the redistribution layer 108. In some embodiments, the conductive pillars 120 include metal, such as copper, titanium, tungsten, aluminum, the like, or a combination thereof. The conductive pillars 120 may be formed by a plating process or any other suitable process.

As shown in FIG. 1, the height of the conductive pillars 120 is greater than the height of the first semiconductor component 110, in accordance with some embodiments. In addition, the height of the conductive pillars 120 may be substantially equal to the total height of the first semiconductor component 110, the conductive vias 112, and the bump structures 116. The conductive pillars 120 may have substantially vertical sidewalls as illustrated. The configuration of the conductive pillars 120 shown in the figures is exemplary only and is not intended to limit the present disclosure. Each of the conductive pillars 120 may have a different shape.

As shown in FIG. 1, the first semiconductor component 110 is disposed on the center of the top surface of the redistribution layer 108, and the numbers of the conductive pillars 120 are equivalent on the opposite sides of the first semiconductor component 110, but the present disclosure is not limit thereto. For example, the numbers of the conductive pillars 120 may be different on the opposite sides of the first semiconductor component 110. Alternatively, the conductive pillars 120 may be disposed on the one side of the first semiconductor component 110.

As shown in FIG. 1, a molding material 122 is disposed on the redistribution layer 108 and surrounds the first semiconductor component 110 and each of the conductive pillars 120, in accordance with some embodiments. The molding material 122 may prevent the first semiconductor component 110 and the conductive pillars 120 from damage due to, for example, the stress, the chemicals and/or the moisture.

In some embodiments, the molding material 122 includes a nonconductive material, such as a moldable polymer, an epoxy, a resin, the like, or a combination thereof. In some embodiments, the molding material 122 is applied in liquid or semi-liquid form, and then is cured using a suitable curing process, such as a thermal curing process, a UV curing process, the like, or a combination thereof. The molding material 122 may be shaped or molded with a mold (not shown).

The molding material 122 may fill in gaps between the first semiconductor component 110 and the conductive pillars 120. The molding material 122 may adjoin the sidewalls of the first semiconductor component 110 and the conductive pillars 120. The sidewall of the molding material 122 may be substantially coplanar with the sidewall of the redistribution layer 108. As mentioned previously, the first semiconductor component 110 may be spaced apart from the redistribution layer 108 by a gap. In this case, the molding material 122 may also fill in the gap between the first semiconductor component 110 and the redistribution layer 108.

As shown in FIG. 1, the semiconductor package structure 100 includes a second semiconductor component 128 over the molding material 122, in accordance with some embodiments. In some embodiments, the second semiconductor component 128 is an active device. For example, the second semiconductor component 128 may include a system-on-chip (SoC) die, a logic device, a memory device, a radio frequency (RF) device, the like, or any combination thereof. For example, the second semiconductor component 128 may include a microcontroller (MCU), a microprocessor (MPU), a power management integrated circuit (PMIC), a global positioning system (GPS) device, a central processing unit (CPU), a graphics processing unit (GPU), a dynamic random access memory (DRAM) controller, a static random-access memory (SRAM), a high bandwidth memory (HBM), the like, or any combination thereof. In some other embodiments, the second semiconductor component 128 includes a passive device, such as resistor, capacitor, inductor, the like, or a combination thereof.

The first semiconductor component 110 and the second semiconductor component 128 may include the same or different devices. For example, the first semiconductor component 110 may be a passive device, and the second semiconductor component 128 may be an active device. Alternatively, the first semiconductor component 110 and the second semiconductor component 128 may be active devices which have different functions and/or are different generation chips.

In some other embodiments, one or more passive devices are also disposed over the redistribution layer 108, such as resistors, capacitors, inductors, the like, or a combination thereof. Although two semiconductor components, the first semiconductor component 110 and the second semiconductor component 128, are shown in FIG. 1, the number of semiconductor components may be more than two.

As shown in FIG. 1, the sidewall of the second semiconductor component 128 may be substantially coplanar with the sidewall of the molding material 122, and may be substantially coplanar with the sidewall of the redistribution layer 108. The second semiconductor component 128 may have a first surface 128a and a second surface 128b which is opposite to the first surface 128a. The first surface 128a of the second semiconductor component 128 may be closer to the second surface 110b of the first semiconductor component 110 than the second surface 128b of the second semiconductor component 128.

In some embodiments, the second surface 128b of the second semiconductor component 128 is exposed as illustrated. As a result, the thermal issues can be solved. The present disclosure is not limit thereto. The second surface 128b of the second semiconductor component 128 may not be exposed in some other embodiments. For example, the second surface 128b of the second semiconductor component 128 may be covered by a molding material.

Still refer to FIG. 1, a plurality of conductive vias 124 and a passivation layer 126 may be disposed on the first surface 128a of the second semiconductor component 128, in accordance with some embodiments. The conductive vias 124 may be disposed in the passivation layer 126 and may be electrically coupled to the second semiconductor component 128. The conductive vias 124 may include metal, such as copper, titanium, tungsten, aluminum, the like, or a combination thereof. In some embodiments, the passivation layer 126 is a polymer layer, for example, polyimide (PI), polybenzoxazole (PBO), benzocyclobutene (BCB), epoxy, the like, or a combination thereof. Alternatively, the passivation layer 126 may be a dielectric layer, such as silicon oxide, silicon nitride, silicon oxynitride, the like, or a combination thereof.

The bump structures 116 may be disposed between the conductive vias 112 and the conductive vias 124, and may electrically couple the conductive vias 112 to the conductive vias 124. That is, the conductive vias 112 and the conductive vias 124 are connected by the bump structures 116 instead of connected by the Cu—Cu bonding technology. As a result, the Cu—Cu bonding technology related issues, such as critical processes for providing enough bonding force, clean surface without impurities, and flat surface, can be avoided. Therefore, the difficulty of manufacturing can be reduced, and the yield can be improved. Low-cost benefit can also be provided. Furthermore, flexibility to different chip sizes and heterogeneous integration with different generation chips can be achieved.

The conductive vias 124 may be electrically coupled to the bump structures 116 and the conductive pillars 120. The second semiconductor component 128 may be electrically coupled to the redistribution layer 108 through the conductive vias 124 and the conductive pillars 120. The second semiconductor component 128 may be electrically coupled to the first semiconductor component 110 through the conductive vias 112, the bump structures 116, and the conductive vias 124. The first semiconductor component 110 may be electrically coupled to the redistribution layer 108 through the conductive vias 112, the bump structures 116, the conductive vias 124, and the conductive pillars 120.

As shown in FIG. 1, the semiconductor package structure 100 includes a plurality of conductive terminals 130 below the substrate 102, in accordance with some embodiments. The conductive terminals 130 may be electrically coupled to the wiring structure of the substrate 102. The conductive terminals 130 may include conductive materials, such as metal. For example, the conductive terminals 130 may be made of copper, titanium, tungsten, aluminum, the like, or a combination thereof. The conductive terminals 130 may be microbumps, controlled collapse chip connection (C4) bumps, ball grid array (BGA) balls, the like, or a combination thereof.

Figure 2:
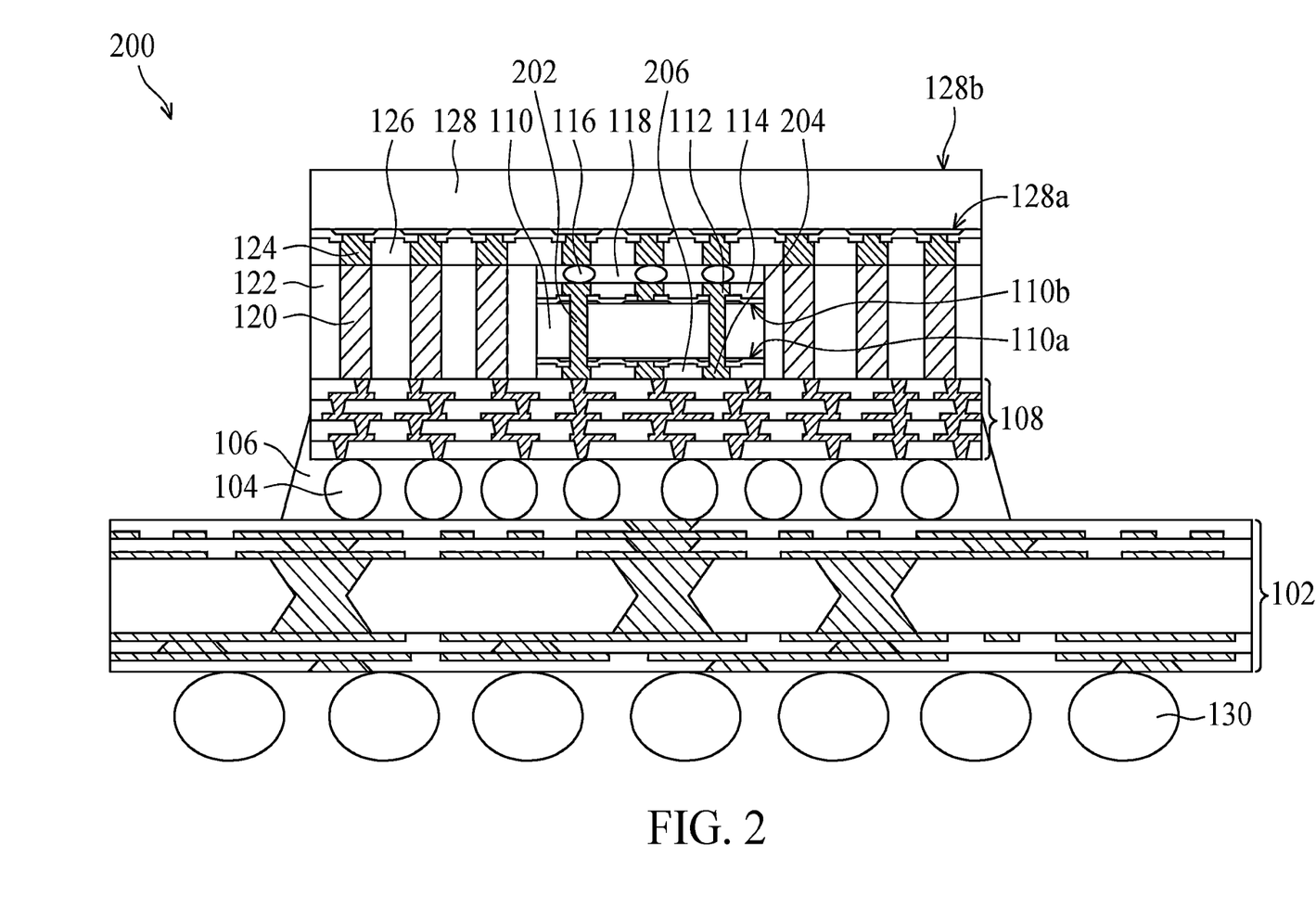

FIG. 2 is a cross-sectional view of a semiconductor package structure 200, in accordance with some other embodiments of the present disclosure. It should be noted that the semiconductor package structure 200 may include the same or similar components as that of the semiconductor package structure 100 shown in FIG. 1, and for the sake of simplicity, those components will not be discussed in detail again. In the following embodiments, the first semiconductor component 110 includes one or more through vias 202 for dual-side connection. That is, opposite surfaces of the first semiconductor component 110 can be used for connection.

The first semiconductor component 110 may have a first surface 110a and a second surface 110b which is opposite to the first surface 110a. The first surface 110a may be closer to the redistribution layer 108 than the second surface 110b. As shown in FIG. 2, the first semiconductor component 110 includes one or more through vias 202 which extend from the first surface 110a to the second surface 110b and have substantially vertical sidewalls, but the present disclosure is not limit thereto. The through vias 202 may have other configurations.

The through vias 202 may be formed of any conductive material, such as metal. For example, the through vias 202 may be formed of copper, titanium, tungsten, aluminum, the like, or a combination thereof. The through vias 202 may be electrically coupled to the second semiconductor component 128 through a plurality of conductive vias 124, and be electrically coupled to the redistribution layer 108 through a plurality of conductive vias 204. The conductive vias 204 and a passivation layer 206 may be disposed on the first surface 110a of the first semiconductor component 110. The conductive vias 204 may be disposed in the passivation layer 206 and may be electrically coupled to the through vias 202 and the redistribution layer 108.

The conductive vias 204 may include metal, such as copper, titanium, tungsten, aluminum, the like, or a combination thereof. In some embodiments, the passivation layer 206 is a polymer layer, for example, polyimide (PI), polybenzoxazole (PBO), benzocyclobutene (BCB), epoxy, the like, or a combination thereof. Alternatively, the passivation layer 206 may be a dielectric layer, such as silicon oxide, silicon nitride, silicon oxynitride, the like, or a combination thereof.

The first semiconductor component 110 may be electrically coupled to the redistribution layer 108 through the conductive vias 204. The second semiconductor component 128 may be electrically coupled to the redistribution layer 108 through the conductive vias 124, the bump structures 116, the conductive vias 112, the through vias 202, and the conductive vias 204 and through the conductive pillars 120.

Figure 3:
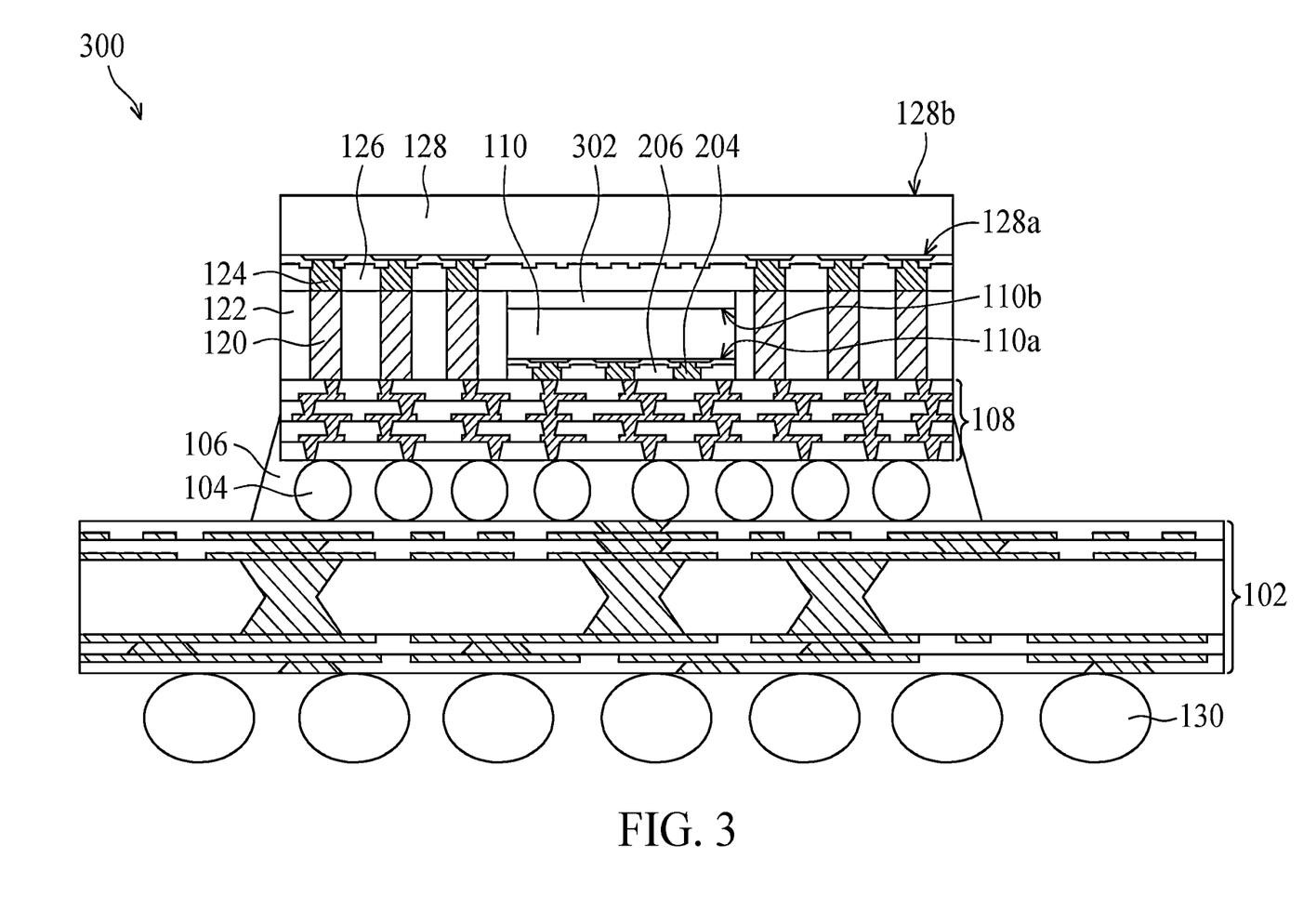

FIG. 3 is a cross-sectional view of a semiconductor package structure 300, in accordance with some other embodiments of the present disclosure. It should be noted that the semiconductor package structure 300 may include the same or similar components as that of the semiconductor package structure 100 shown in FIG. 1, and for the sake of simplicity, those components will not be discussed in detail again. In comparison with the embodiment of FIGS. 1 and 2 where the semiconductor components are connected by bump structures, the semiconductor components are connected by a redistribution layer in the following embodiments.

The first semiconductor component 110 may be electrically coupled to the redistribution layer 108 through the conductive vias 204, and the second semiconductor component 128 may be electrically coupled to the redistribution layer 108 through the conductive vias 124 and the conductive pillars 120. In particular, the redistribution layer 108 may integrate the signals from the first semiconductor component 110 and the second semiconductor component 128. That is, the first semiconductor component 110 is electrically coupled to the second semiconductor component 128 through the conductive vias 204, the redistribution layer 108, the conductive pillars 120, and the conductive vias 124, in accordance with some embodiments. Since the first semiconductor component 110 and the second semiconductor component 128 are not connected by the Cu—Cu bonding technology, the related issues can be prevented.

As shown in FIG. 3, an adhesive layer 302 may be formed on the second surface 110b of the first semiconductor component 110. The adhesive layer 302 may be a die attach film (DAF), a backside coating tape (LC) tape, a prepreg material, the like, or a combination thereof. The adhesive layer 302 may be made of epoxy resin or any suitable materials.

Figure 4:
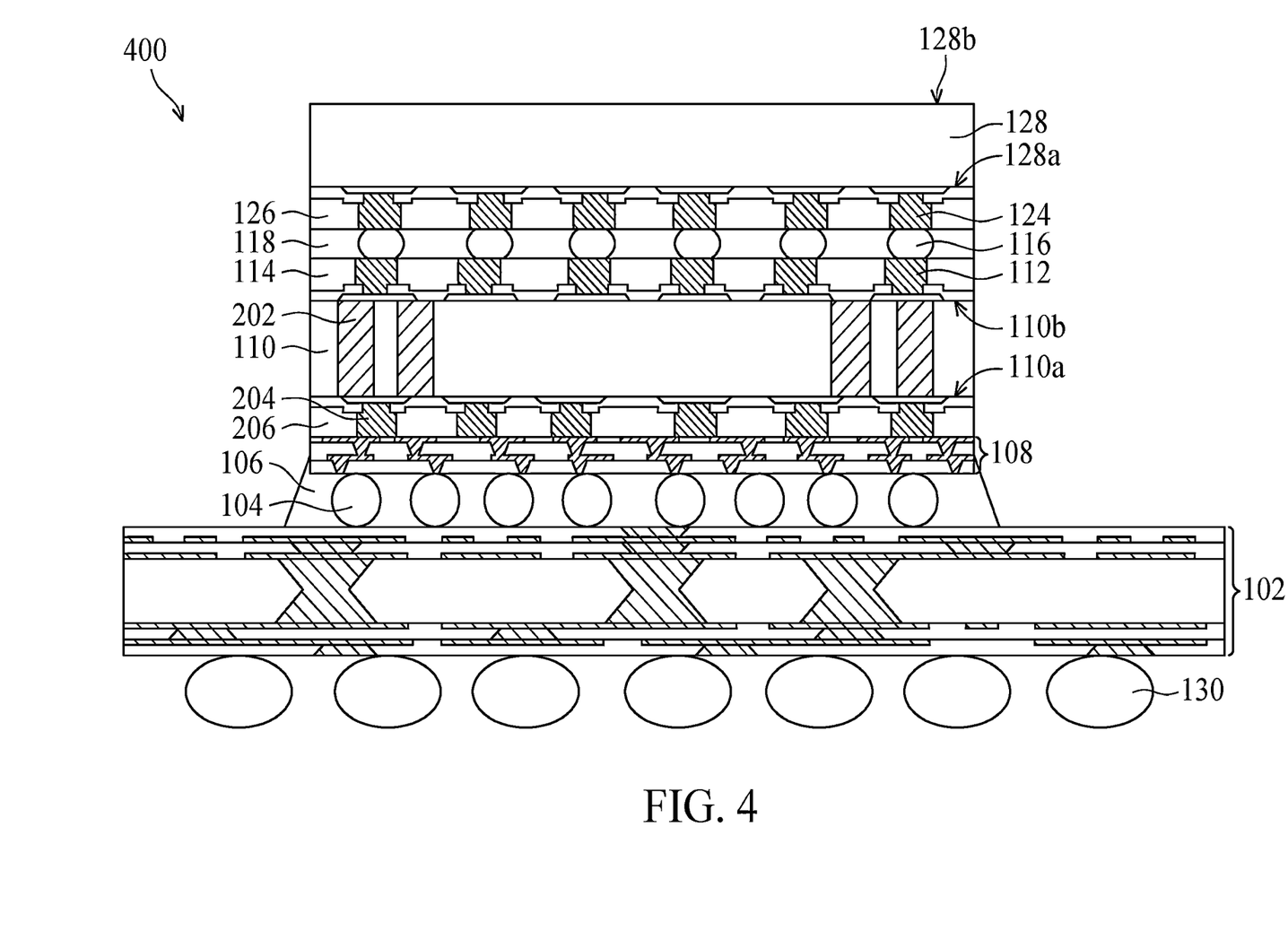

FIG. 4 is a cross-sectional view of a semiconductor package structure 400, in accordance with some other embodiments of the present disclosure. It should be noted that the semiconductor package structure 400 may include the same or similar components as that of the semiconductor package structure 200 shown in FIG. 2, and for the sake of simplicity, those components will not be discussed in detail again. In the following embodiments, the first semiconductor component 110 and the second semiconductor component 128 have the similar sizes. The conductive pillars (e.g. conductive pillars 120 as shown in FIG. 2) may be eliminated.

As shown in FIG. 4, the first semiconductor component 110 includes one or more through vias 202 for dual-side connection. That is, opposite surfaces of the first semiconductor component 110 can be used for connection. The first semiconductor component 110 may have a first surface 110a and a second surface 110b which is opposite to the first surface 110a. The first surface 110a may be closer to the redistribution layer 108 than the second surface 110b. As shown in FIG. 4, the first semiconductor component 110 includes one or more through vias 202 which extend from the first surface 110a of the first semiconductor component 110 to the second surface 110b of the first semiconductor component 110 and have substantially vertical sidewalls, but the present disclosure is not limit thereto. The through vias 202 may have other configurations.

The through vias 202 may be formed of any conductive material, such as metal. For example, the through vias 202 may be formed of copper, titanium, tungsten, aluminum, the like, or a combination thereof. The first semiconductor component 110 may have a plurality of conductive vias 204 on the first surface 110a and a plurality of conductive vias 112 on the second surface 110b. The through vias 202 may be electrically coupled to the conductive vias 112 and the conductive vias 204, and electrically coupled to the redistribution layer 108 through the conductive vias 204.

The second semiconductor component 128 may have a plurality of conductive vias 124 on the first surface 128a, and the second surface 128b of the second semiconductor component 128 may be exposed. A plurality of bump structures 116 may be disposed between and electrically coupled to the conductive vias 124 and the conductive vias 112. Thus, the second semiconductor component 128 may be electrically coupled to the redistribution layer 108 through the conductive vias 124, the bump structures 116, the conductive vias 112, the through vias 202, and the conductive vias 204.

Since the conductive vias 112 and the conductive vias 124 are connected by the bump structures 116, the Cu—Cu bonding technology may be eliminated. Therefore, the difficulty of manufacturing and be reduced, and the yield can be improved. The manufacturing cost can also be lowered. The bump structures 116 can be used for connecting semiconductor components with different sizes (e.g. in the semiconductor package structures 100, 200, and 300), and can be used for connecting semiconductor components with similar sizes (e.g. in the semiconductor package structure 400) as well.

Figure 5:
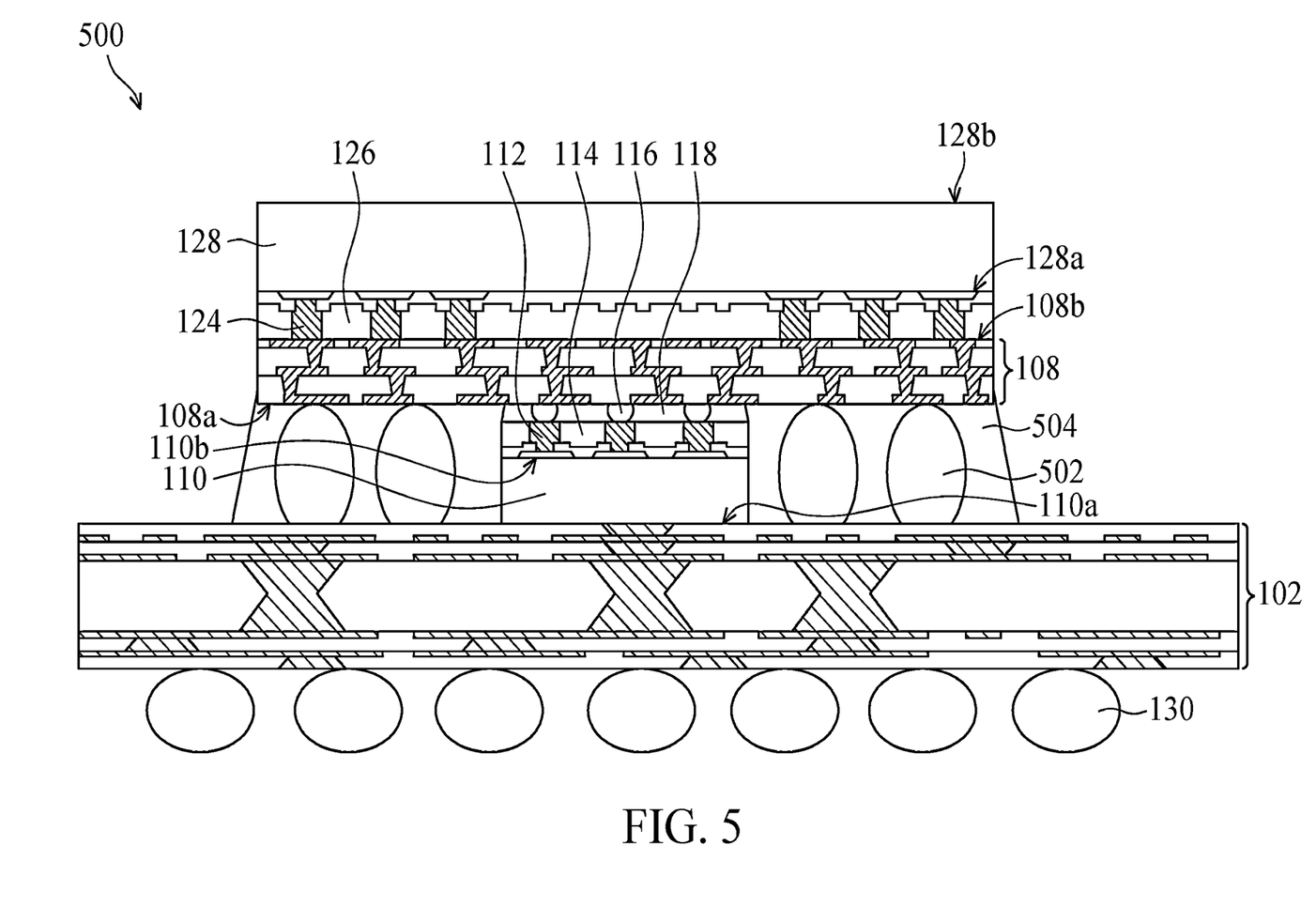

FIG. 5 is a cross-sectional view of a semiconductor package structure 500, in accordance with some other embodiments of the present disclosure. It should be noted that the semiconductor package structure 500 may include the same or similar components as that of the semiconductor package structure 100 shown in FIG. 1, and for the sake of simplicity, those components will not be discussed in detail again. In the following embodiments, the first semiconductor component 110 is disposed between the substrate 102 and the redistribution layer 108.

As shown in FIG. 5, the redistribution layer 108 may have a first surface 108a and a second surface 108b which is opposite to the first surface 108b. The first surface 108a may be closer to the substrate 102 than the second surface 108b. The first semiconductor component 110 may be disposed on the first surface 108a of the redistribution layer 108. The redistribution layer 108 may laterally extend beyond the sidewalls of the first semiconductor component 110. A plurality of bump structures 116 and a plurality of conductive vias 112 may be disposed between the first semiconductor component 110 and the redistribution layer 108, and may electrically couple the first semiconductor component 110 to the redistribution layer 108.

The semiconductor package structure 500 includes a plurality of bump structures 502 on the first surface 108a of the redistribution layer 108, in accordance with some embodiments. The bump structures 502 may be formed between the redistribution layer 108 and the substrates 102, and may electrically couple the redistribution layer 108 to the substrates 102. That is, signal outputs from the bump structures 502 to the substrate 102. In some embodiments, the bump structures 502 include conductive materials, such as metal. For example, the bump structures 502 may be made of copper, titanium, tungsten, aluminum, the like, or a combination thereof. The bump structures 502 may be microbumps, controlled collapse chip connection (C4) bumps, ball grid array (BGA) balls, the like, or a combination thereof.

The bump structures 502 may be adjacent to the first semiconductor component 110. The bump structures 502 may be disposed on opposite sides of the first semiconductor component 110, and the numbers of the bump structures 502 may be same or different on the opposite sides of the first semiconductor component 110. In addition, the height of the bump structures 502 may be substantially equal to the total height of the first semiconductor component 110, the conductive vias 112, and the bump structures 116.

The first semiconductor component 110 and the bump structures 502 may be surrounded by an underfill material 504. The conductive vias 112 and the bump structures 116 may also be surrounded by the underfill material 504. In some embodiments, the underfill material 504 is between the substrates 102 and the redistribution layer 108, and fills in gaps between the first semiconductor component 110 and the bump structures 502 to provide structural support.

In some embodiments, the underfill material 504 may be dispensed with capillary force after the first semiconductor component 110 and the bump structures 502 are formed between the substrates 102 and the redistribution layer 108. Then, the underfill material 504 may be cured using a suitable curing process, such as a thermal cure process, a ultra-violet (UV) cure process, or the like. The underfill material 504 may be formed of polymer, such as epoxy.

The underfill material 504 may cover a portion of the top surface of the substrate 102, and another portion of the top surface of the substrate 102 may be exposed. The underfill material 504 may extend to the sidewall of the redistribution layer 108, and may cover a portion of the sidewall of the redistribution layer 108.

The second semiconductor component 128 may be disposed on the second surface 108b of the redistribution layer 108. A plurality of conductive vias 124 may be disposed between the second semiconductor component 128 and the redistribution layer 108, and may electrically couple the second semiconductor component 128 to the redistribution layer 108. The second semiconductor component 128 may be electrically coupled to the wiring structure of the substrate 102 through the conductive vias 124, the redistribution layer 108 and the bump structures 502.

The first semiconductor component 110 is electrically coupled to the second semiconductor component 128 through the conductive vias 112, the bump structures 116, the redistribution layer 108, and the conductive vias 124, in accordance with some embodiments. In particular, the redistribution layer 108 may integrate the signals from the first semiconductor component 110 and the second semiconductor component 128. As a result, the Cu—Cu bonding technology related issues can be prevented.

In summary, the present disclosure provides semiconductor package structures having semiconductor components which are stacked by bump structures and/or by a redistribution layer. In some embodiments, the semiconductor components are connected by the bump structures. In some other embodiments, signals from the semiconductor components can be integrated by the redistribution layer. As a result, critical processes due to the Cu—Cu bonding technology can be eliminated. That is, the difficulty of manufacturing can be reduced, and thus the yield can be improved. The manufacturing costs can be lowered as well. Moreover, flexibility to different chip sizes and heterogeneous integration with different generation chips can be achieved. In some embodiments, the thermal issues can also be solved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a substrate;
   a redistribution layer over the substrate and having a first surface and a second surface opposite to the first surface;
   a plurality of first bump structures on the first surface of the redistribution layer and electrically coupling the redistribution layer to a wiring structure of the substrate;
   a first semiconductor component on the first surface of the redistribution layer and adjacent to the plurality of first bump structures;
   a first passivation layer on the first semiconductor component;
   a plurality of first conductive vias in the first passivation layer and electrically coupled to the first semiconductor component;
   a plurality of second bump structures between the redistribution layer and the first conductive vias and directly connecting the redistribution layer and the first conductive vias;
   a second semiconductor component on the second surface of the redistribution layer; and
   a first underfill material that surrounds the plurality of first bump structures, wherein the first underfill material is in direct contact with a top surface of a first portion of the substrate and exposes a top surface of a second portion of the substrate, wherein the top surface of the first portion of the substrate is substantially level with the top surface of the second portion of the substrate,
   wherein the second semiconductor component is electrically coupled to the first semiconductor component through the redistribution layer, and is electrically coupled to the wiring structure of the substrate through the plurality of first bump structures.

2. The semiconductor package structure as claimed in claim 1, wherein the first semiconductor component is electrically coupled to the redistribution layer through the plurality of second bump structures.

3. The semiconductor package structure as claimed in claim 1, wherein the first underfill material surrounds the plurality of second bump structures.

4. The semiconductor package structure as claimed in claim 1, wherein the first underfill material covers sidewalls of the first semiconductor component.

5. The semiconductor package structure as claimed in claim 1, wherein the plurality of first bump structures have a height greater than a height of the first semiconductor component.

6. The semiconductor package structure as claimed in claim 1, wherein the redistribution layer laterally extends beyond sidewalls of the first semiconductor component.

7. The semiconductor package structure as claimed in claim 1, further comprising a second underfill material on the first passivation layer and surrounded by the first underfill material.

8. The semiconductor package structure as claimed in claim 1, wherein the first underfill material extends continuously from above the first surface of the redistribution layer to a top surface of the substrate.

9. The semiconductor package structure as claimed in claim 1, further comprising:
   a second passivation layer on the second semiconductor component; and
   a plurality of second conductive vias in the second passivation layer and electrically coupled to the redistribution layer.

10. The semiconductor package structure as claimed in claim 9, wherein the second passivation layer and the plurality of second conductive vias are in direct contact with the redistribution layer.

11. The semiconductor package structure as claimed in claim 9, wherein a sidewall of the second passivation layer is coplanar with a sidewall of the redistribution layer.

12. The semiconductor package structure as claimed in claim 9, wherein a sidewall of the second semiconductor component is coplanar with a sidewall of the redistribution layer.

13. The semiconductor package structure as claimed in claim 1, wherein a height of the plurality of first bump structures is substantially equal to a total height of the first semiconductor component, one of the plurality of first conductive vias, and one of the plurality of second bump structures.

14. The semiconductor package structure as claimed in claim 1, further comprising:
   conductive terminals below the substrate,
   wherein the conductive terminals are in direct contact with a bottom surface of the first portion of the substrate and a bottom surface of the second portion of the substrate.

* * * * *